(12) United States Patent
Kobayashi

(10) Patent No.: US 8,203,390 B2
(45) Date of Patent: Jun. 19, 2012

(54) LOCAL OSCILLATOR AND PHASE ADJUSTING METHOD FOR THE SAME

(75) Inventor: Hiroyuki Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 12/886,142

(22) Filed: Sep. 20, 2010

(65) Prior Publication Data

US 2011/0234270 A1 Sep. 29, 2011

(30) Foreign Application Priority Data

Mar. 25, 2010 (JP) ................................. 2010-069757

(51) Int. Cl.
*H03L 7/06* (2006.01)
(52) U.S. Cl. ............................ 331/16; 341/143; 375/376
(58) Field of Classification Search .................... 331/16; 341/143; 375/376
See application file for complete search history.

(56) References Cited

U.S. PATENT DOCUMENTS

2007/0189431 A1* 8/2007 Waheed et al. ............... 375/376

FOREIGN PATENT DOCUMENTS

| JP | 07095060 | 4/1995 |
|---|---|---|
| JP | 07120941 | 12/1995 |
| JP | 2009021954 | 1/2009 |
| JP | 2009111652 | 5/2009 |
| JP | 2009177259 | 8/2009 |
| JP | 2009268047 | 11/2009 |

OTHER PUBLICATIONS

Staszewski, et al.; All-Digital PLL and Transmitter for Mobile Phones, IEEE Journal of Solid-State Circuits, vol. 40, No. 12, Dec. 2005, pp. 2469-2482.
Grollitsch, et al.; A 1.4psrms-Period-Jitter TDC-Less Fractional-N Digital PLL with Digitally Controlled Ring Oscillator in 65nm CMOS, 2010 IEEE International Solid-State Circuits Conference, pp. 478-480.

* cited by examiner

*Primary Examiner* — James E Goodley
(74) *Attorney, Agent, or Firm* — Turocy & Watson, LLP

(57) ABSTRACT

According to one embodiment, a local oscillator includes a digitally-controlled oscillator that outputs an oscillating signal having a frequency N times as large as an oscillating frequency according to an oscillator tuning word; a frequency divider that performs a 1/N frequency division of the oscillating signal, and outputs a 2N phase clock; a counter that counts the clock and outputs the count value as integer oscillator phase data based upon a reference signal; a first flip-flop that latches the clock with the reference signal, and outputs the resultant as first phase information; a variable delay circuit that delays the reference signal and outputs the resultant as a delay reference signal; a second flip-flop that latches the clock with the delay reference signal, and outputs the resultant as second phase information; a delay control unit that controls a delay amount of the variable delay circuit; a data conversion unit that outputs fractional oscillator phase data based upon the first and second phase information; an adder that adds the integer oscillator phase data and the fractional oscillator phase data, and outputs the added value as third phase information; and a filter that smoothes the difference between a reference phase for setting the oscillating frequency of the digitally-controlled oscillator and the third phase information so as to output the oscillator tuning word.

12 Claims, 19 Drawing Sheets

| TD [7:0]     | TD [7:4]  | φRFf   |
|--------------|-----------|--------|
| 8'b10000111  | 4'b1000   | 3'b000 |
| 8'b11000011  | 4'b1100   | 3'b001 |
| 8'b11100001  | 4'b1110   | 3'b010 |
| 8'b11110000  | 4'b1111   | 3'b011 |
| 8'b01111000  | 4'b0111   | 3'b100 |
| 8'b00111100  | 4'b0011   | 3'b101 |
| 8'b00011110  | 4'b0001   | 3'b110 |
| 8'b00001111  | 4'b0000   | 3'b111 |

FIG.6

| TD [7:0] | TDd [7:0] | φRFf |
|---|---|---|
| 8'b10000111 | 8'b10000111 | 4'b0000 |
| 8'b11000011 | 8'b11000011 | 4'b0010 |
| 8'b11100001 | 8'b11100001 | 4'b0100 |
| 8'b11110000 | 8'b11110000 | 4'b0110 |
| 8'b01111000 | 8'b01111000 | 4'b1000 |
| 8'b00111100 | 8'b00111100 | 4'b1010 |
| 8'b00011110 | 8'b00011110 | 4'b1100 |
| 8'b00001111 | 8'b00001111 | 4'b1110 |

FIG.7

| TD [7:0] | TDd [7:0] | φRFf |
|---|---|---|
| 8'b10000111 | 8'b11000011 | 4'b0001 |
| 8'b11000011 | 8'b11100001 | 4'b0011 |
| 8'b11100001 | 8'b11110000 | 4'b0101 |
| 8'b11110000 | 8'b01111000 | 4'b0111 |
| 8'b01111000 | 8'b00111100 | 4'b1001 |
| 8'b00111100 | 8'b00011110 | 4'b1011 |
| 8'b00011110 | 8'b00001111 | 4'b1101 |
| 8'b00001111 | 8'b10000111 | 4'b1111 |

FIG.9

| TD [7:0] | TDd [7:0] | φRFf |
|---|---|---|
| 8'b10000111 | 8'b11000011 | 4'b0000 |
| 8'b11000011 | 8'b11100001 | 4'b0010 |
| 8'b11100001 | 8'b11110000 | 4'b0100 |
| 8'b11110000 | 8'b01111000 | 4'b0110 |
| 8'b01111000 | 8'b00111100 | 4'b1000 |
| 8'b00111100 | 8'b00011110 | 4'b1010 |
| 8'b00011110 | 8'b00001111 | 4'b1100 |
| 8'b00001111 | 8'b10000111 | 4'b1110 |

FIG.10

| TD [7:0] | TDd [7:0] | φRFf |
|---|---|---|
| 8'b10000111 | 8'b11100001 | 4'b0001 |
| 8'b11000011 | 8'b11110000 | 4'b0011 |
| 8'b11100001 | 8'b01111000 | 4'b0101 |
| 8'b11110000 | 8'b00111100 | 4'b0111 |
| 8'b01111000 | 8'b00011110 | 4'b1001 |
| 8'b00111100 | 8'b00001111 | 4'b1011 |
| 8'b00011110 | 8'b10000111 | 4'b1101 |
| 8'b00001111 | 8'b11000011 | 4'b1111 |

| TD-to-PD CONVERTER | TD [7:0] → PD [2:0] | |
|---|---|---|
| | 8'b10000111 | 3'b000 |
| | 8'b11000011 | 3'b001 |
| | 8'b11100001 | 3'b010 |
| | 8'b11110000 | 3'b011 |
| | 8'b01111000 | 3'b100 |
| | 8'b00111100 | 3'b101 |
| | 8'b00011110 | 3'b110 |
| | 8'b00001111 | 3'b111 |

| TD [7:0]      | TD [7:4] | φRFf   |
|---------------|----------|--------|
| 8'b10000111   | 4'b1000  | 3'b000 |
| 8'b11000011   | 4'b1100  | 3'b001 |
| 8'b11100001   | 4'b1110  | 3'b010 |
| 8'b11110000   | 4'b1111  | 3'b011 |
| 8'b01111000   | 4'b0111  | 3'b100 |
| 8'b00111100   | 4'b0011  | 3'b101 |
| 8'b00011110   | 4'b0001  | 3'b110 |
| 8'b00001111   | 4'b0000  | 3'b111 |

LOCAL OSCILLATOR AND PHASE ADJUSTING METHOD FOR THE SAME

CROSS-REFERENCE TO RELATED APPLICATIONS

This application is based upon and claims the benefit of priority from Japanese Patent Application No. 2010-09757, filed on Mar. 25, 2010; the entire contents of which are incorporated herein by reference.

FIELD

Embodiments described herein relate generally to a local oscillator and phase adjusting method for the same.

BACKGROUND

Recently, an ADPLL (All Digital PLL) circuit in which all control signals of a PLL (Phase Locked Loop) circuit are digitized is used in a wireless communication device such as a wireless LAN device. In the ADPLL circuit, an analog circuit is replaced by a digital circuit, so that space saving and power saving can be attained due to progress in a process.

The ADPLL circuit includes a digital loop filter, a DCO (Digitally-Controlled Oscillator), a counter, and a TDC (Time-to-Digital Converter). The counter counts an output CKV of the DCO, and outputs a count value based upon a reference signal that is synchronized by the output CKV of the DCO. The TDC takes out a phase difference of not more than 1 cycle of the output from the DCO in synchronism with the reference signal REF. A result of a comparison (difference) between the value obtained by adding the count value and the phase difference and a phase control signal is given to the digital loop filter. The oscillating frequency of the DCO is controlled based upon the output from the digital loop filter.

In the ADPLL described above, the above-mentioned TDC is inevitable in order to reduce the impact of discretization and enhance phase noise characteristic of the output CKV. In general, the TDC frequently uses a circuit that utilizes a delay element in order to obtain phase information having high resolution. The delay amount is not constant, and the obtained delay information has to be normalized for 1 cycle of the oscillating frequency in order to make the delay amount a value that can be utilized in the digital circuit (e.g., see "Robert Bogdan Staszewski, et. al, "All-Digital PLL and Transmitter for Mobile Phones", IEEE JOURNAL OF SOLID-STATE CIRCUITES, VOL. 40, NO. 12, DECEMBER 2005").

However, since the TDC having the normalization circuit has great power consumption and a large area, it is desired to constitute the ADPLL without using the TDC.

In "Werner Grollitsch, Roberto Nonis, Nicola Da Dalt "26.6 A 1.4 psrms-Period-Jitter TDC-less Fractional-N Digital PLL with Digitally Controlled Ring Oscillator in 65 nm CMOS", 2010 IEEE International Solid-State Circuits Conference", the TDC-less ADPLL is proposed. It also proposes a method of generating fine phase information without changing an oscillating frequency, by increasing a delay stage of an LC oscillator in an ADPLL of TDC-integration type using a ring oscillator.

However, in the structure of the LC oscillator and a frequency divider as described in the above-mentioned document, the oscillating frequency has to be increased with respect to a necessary phase interval. Therefore, increasing the oscillating frequency only to obtain the finer phase interval increases power consumption.

BRIEF DESCRIPTION OF THE DRAWINGS

FIG. 6 is a table illustrating a relationship of TD[7:0], TDd[7:0], and φRFf;

FIG. 7 is a table illustrating a relationship of TD[7:0], TDd[7:0], and φRFf;

FIG. 9 is a table illustrating a relationship of TD[7:0], TDd[7:0], and φRFf;

FIG. 10 is a table illustrating a relationship of TD[7:0], TDd[7:0], and φRFf;

DETAILED DESCRIPTION

In general, according to one embodiment, a local oscillator includes a digitally-controlled oscillator that outputs an oscillating signal having a frequency N times as large as an oscillating frequency according to an oscillator tuning word; a frequency divider that performs a 1/N frequency division to the oscillating signal, and outputs a 2N phase clock; a counter that counts the clock and outputs the count value as integer oscillator phase data based upon a reference signal; a first flip-flop that latches the clock with the reference signal, and outputs the resultant as first phase information; a variable delay circuit that delays the reference signal and outputs the resultant as a delay reference signal; a second flip-flop that latches the clock with the delay reference signal, and outputs the resultant as second phase information; a delay control unit that controls a delay amount of the variable delay circuit; a data conversion unit that outputs fractional oscillator phase data based upon the first and second phase information; an adder that adds the integer oscillator phase data and the fractional oscillator phase data, and outputs the added value as third phase information; and a filter that smoothes the difference between a reference phase for setting the oscillating frequency of the digitally-controlled oscillator and the third phase information so as to output the oscillator tuning word.

Exemplary embodiments of local oscillator and phase adjusting method for the same will be described below in detail with reference to the attached drawings. The present invention is not limited to the embodiments.

Embodiment 1

Figure 1:
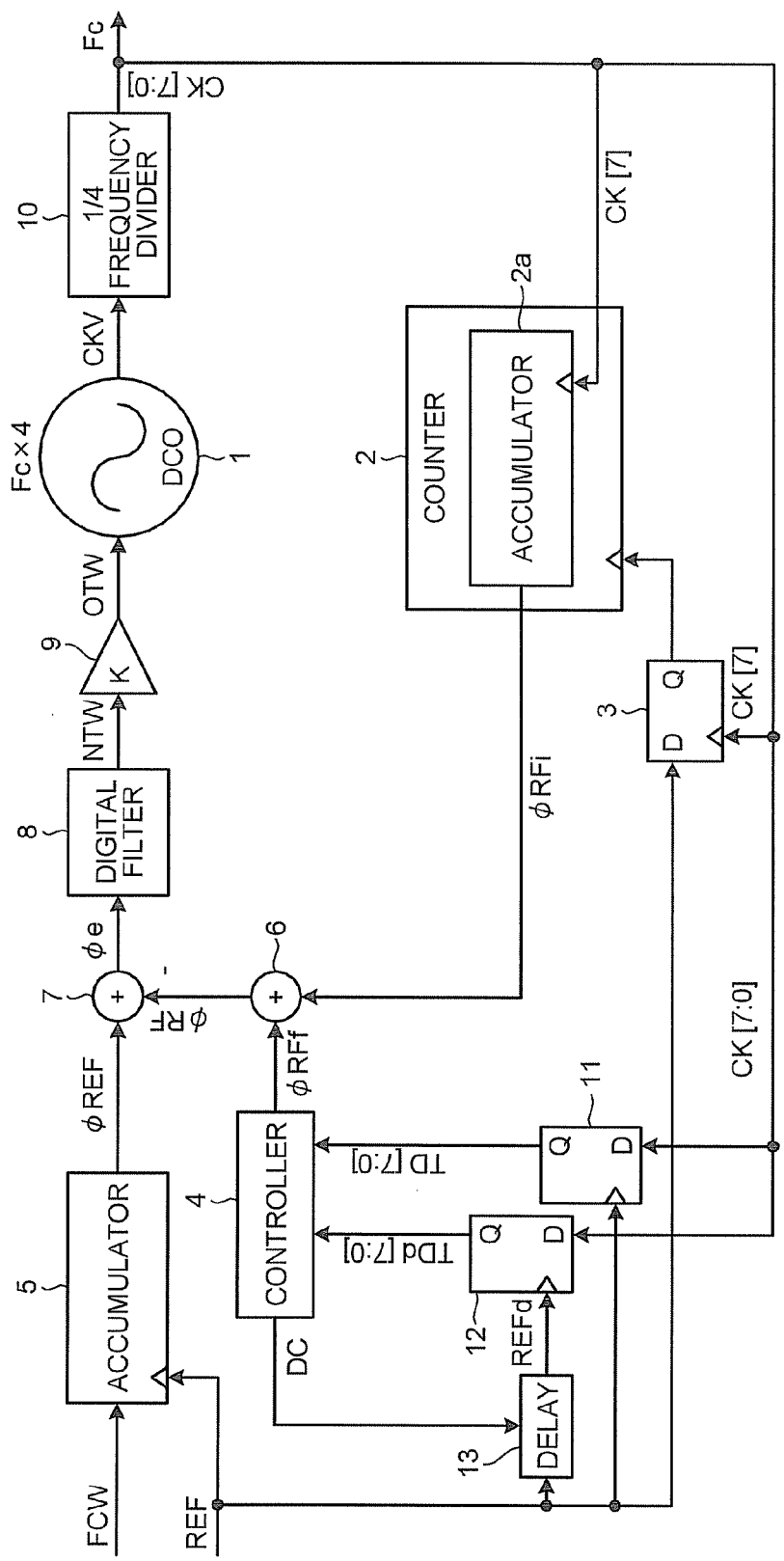
FIG. 1 illustrates a schematic configuration of a TDC-less ADPLL according to an embodiment 1.

FIG. 1 illustrates an example of a schematic configuration of a TDC-less ADPLL according to the embodiment 1. As illustrated in FIG. 1, the ADPLL according to the present embodiment includes a DCO 1, a counter 2, a flip-flop 3, a controller 4 (Data Converter & Delay Controller), an accumulator 5, an adder 6, a subtractor 7, a digital filter 8, a gain correcting device 9, a 1/4 frequency divider 10, flip-flops 11 and 12, and a variable delay circuit 13. In the present embodiment, the function of the TDC is realized by the controller 4, the flip-flops 11 and 12, and the variable delay circuit 13.

The DCO 1 is an oscillator that can discretely control an oscillating frequency with an OTW (Oscillator Tuning Word). It increases the oscillating frequency Fc according to the oscillator tuning word OTW by a factor of four, and outputs the resultant as an oscillator output signal CKV. The DCO 1 is realized by, for example, executing a binary control to plural (MOS) varactors. The 1/4 frequency divider 10 outputs a CK[7:0] that is obtained by performing 1/4 frequency division to the oscillator output signal CKV.

The flip-flop 3 latches the value of a reference signal REF as using the CK[7] of the 1/4 frequency divider 10 for a clock input, and outputs the resultant to the counter 2. Specifically, the output from the flip-flop 3 becomes the reference signal REF that is synchronized with CK[7].

The counter 2 has an accumulator 2a to which CK[7] of the 1/4 frequency divider 10 is applied. The output signal of the flip-flop 3 is applied to the counter 2 as a clock. In synchronism with the clock, the counter 2 outputs the counter value of the accumulator 2a to the adder 6 as integer oscillator phase data $\phi$RFi. Therefore, the CK[7] becomes a reference phase of an oscillator phase signal.

The flip-flop 11 latches the value of CK[7:0] of the 1/4 frequency divider 10 using the reference signal REF as a clock input, and outputs thermometer phase information (first phase information) TD[7:0] to the controller 4.

The delay amount of the variable delay circuit 13 is set by the delay control value DC from the controller 4. The variable delay circuit 13 outputs a delay reference signal REFd, which is obtained by delaying the reference signal REF by the set delay amount, to the flip-flop 12 as a clock. The flip-flop 12 latches the value of CK[7:0] of the 1/4 frequency divider 10 using the delay reference signal REFd as a clock input, and outputs delay thermometer phase information (second phase information) TDd[7:0] to the controller 4.

The controller 4 sets the delay amount of the variable delay circuit 13 by the delay control value DC. The controller 4 also performs a data conversion of the TD[7:0] and TDd[7:0], and outputs fractional oscillator phase data $\phi$RFf to the adder 6.

The adder 6 adds $\phi$RFi outputted from the counter 2 and $\phi$RFf outputted from the controller 4, and outputs oscillator phase data $\phi$RF (third phase information) to the subtractor 7.

The accumulator 5 integrates the value, which is obtained by normalizing a frequency command word FCW by the reference signal FEF, and outputs the integrated value to the subtractor 7 as reference phase data $\phi$REF. The subtractor 7 calculates the difference between $\phi$REF and $\phi$RF inputted from the adder 6, and outputs the resultant to the digital filter 8 as phase error data $\phi$e.

The digital filter 8 operates as a low-pass filter. It smoothes the applied $\phi$e, and outputs the resultant to the gain correcting device 9 as a normalized tuning word NTW.

The gain correcting device 9 multiplies the output value of the digital filter 8 by a coefficient K to output OTW. A frequency gain for the control value of the DCO 1 is corrected through the multiplication by the coefficient K.

When an output frequency Fc of the 1/4 frequency divider 10 is higher (or lower) than a value set by FCW, the OTW that controls to lower (or raise) the oscillating frequency by the digital filter 8 and the gain correcting device 9 based upon the $\phi$e calculated by the subtractor 7 is outputted. Thus, the control for allowing the oscillating frequency of the DCO 1 to be constant is performed.

Figure 2:
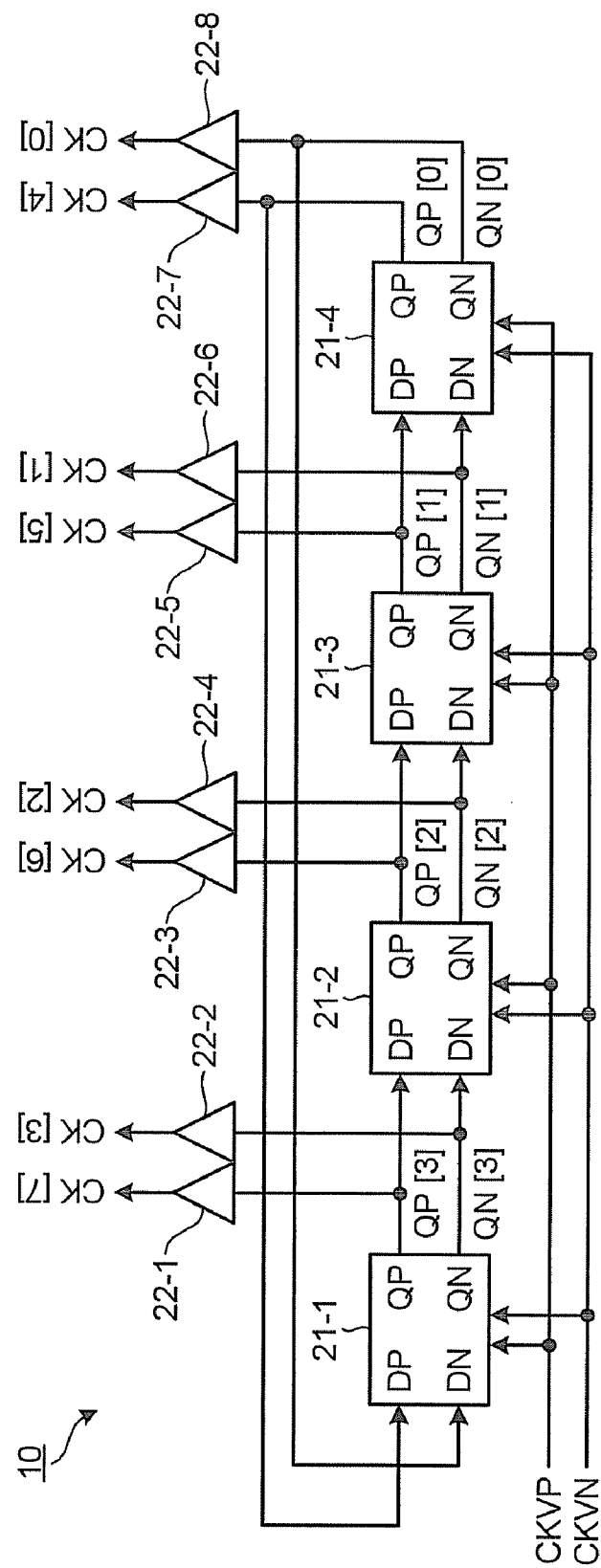
FIG. 2 is a view illustrating an example of a structure of a 1/4 frequency divider.
Figures 3, 4:
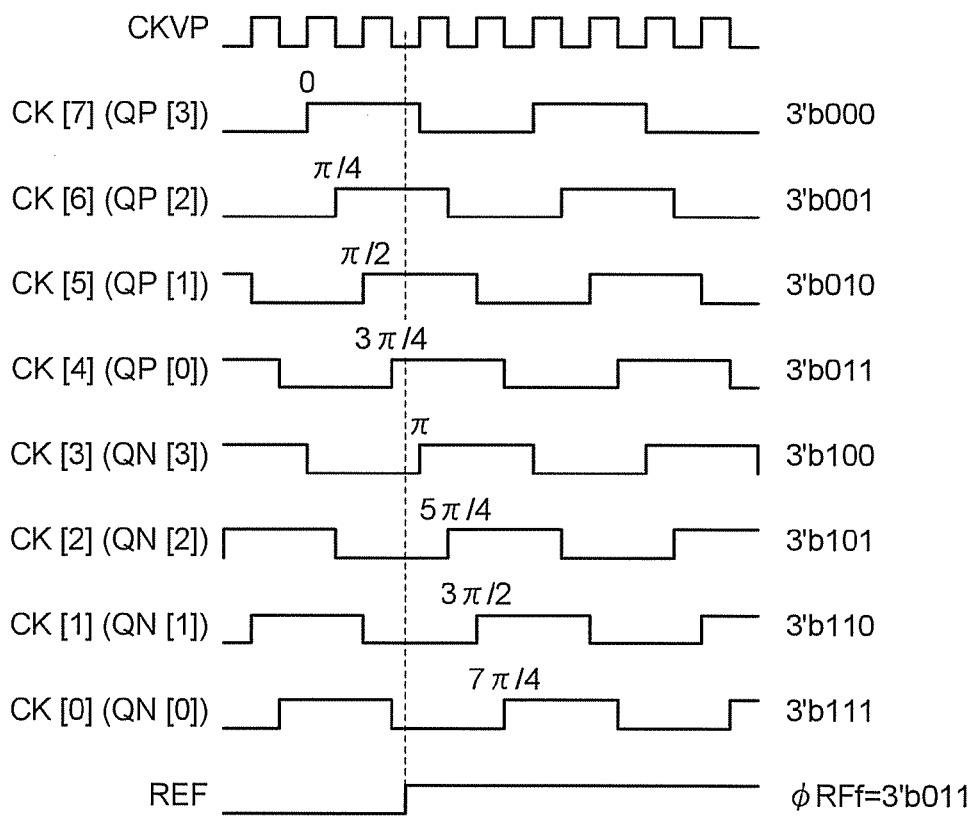
FIG. 3 is a view illustrating an example of a timing chart of the 1/4 frequency divider.
FIG. 4 is a table illustrating a relationship of TD[7:0], TD[7:4], and φRFf.

FIG. 2 is a view illustrating the example of the structure of the 1/4 frequency divider 10. FIG. 3 is a view illustrating one example of a timing chart of the 1/4 frequency divider 10. FIG. 4 is a table illustrating the relationship of TD[7:0], TD[7:4], and $\phi$RFf. The 1/4 frequency divider 10 includes buffers 22-1 to 22-8 and latches 21-1 to 21-4 that are serially connected as illustrated in FIG. 2.

As described above, the DCO 1 oscillates with a frequency four times as large as the output frequency Fc. The 1/4 frequency divider 10 outputs 8-phase signals CK[7] to CK[0], which are obtained by frequency-dividing CKV by 4 from various difference signals CKVP (CKV), and CKVN (inversion of CKV). If CK[7] is defined as a phase reference, CK[6:0] represents a phase transition by $\pi$/4 from CK[7] defined as a starting point. When CK[7:0] is taken at a certain time by using the reference signal REF (the rising edge of the reference signal REF) (wavy line in FIG. 3), the portion where the signal is changed from [1] to [0] becomes relative phase information of CK to the reference signal REF.

The relationship of TD[7:0], TD[7:4], and $\phi$RFf in this case is as illustrated in FIG. 4, when CK[7] of the 1/4 frequency divider 10 is defined as a reference. Since CK[7:4]/CK[3:0] is in a differential relationship, the same output can be obtained only by high-order 4 bits.

As described above, it becomes unnecessary to normalize the data, which is obtained by the cycle of the oscillator in the TDC of the conventional ADPLL by using the phase information of the 1/4 frequency divider 10. Since the output of the 1/4 frequency divider 10 is utilized as the data of TDC, a circuit corresponding to the TDC does not have to be provided, whereby an area corresponding to an operation circuit for the output of TDC and the TDC circuit itself as well as power consumption can be reduced.

Figure 5:
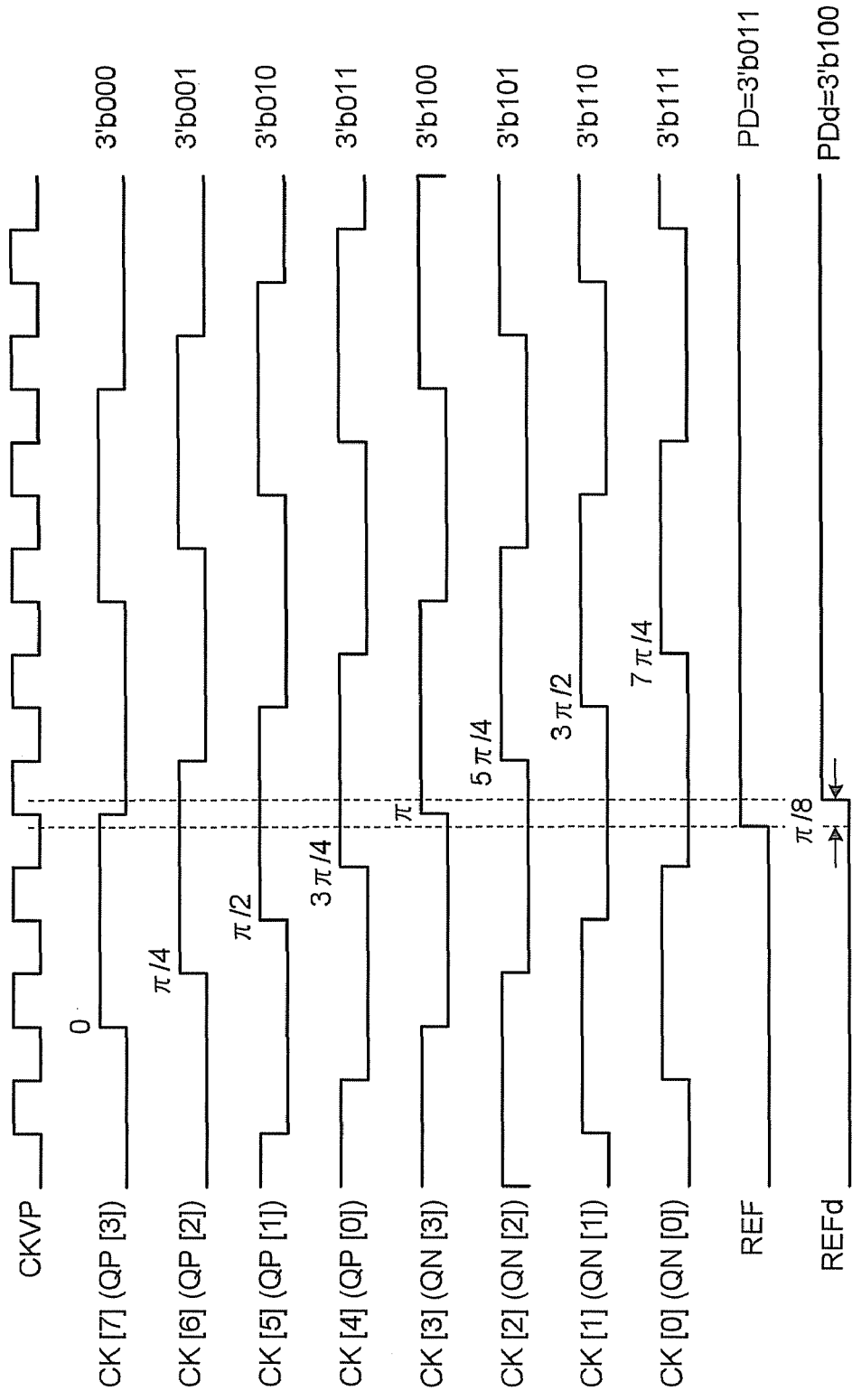
FIG. 5 is a view for describing an output of the 1/4 frequency divider and π/8 interpolation.

FIG. 5 is a view for describing the output of 1/4 frequency division and $\pi$/8 interpolation. It is the view obtained by adding the delay reference signal REFd to FIG. 3. FIGS. 6 and 7 are views illustrating the relationship of TD[7:0], TDd[7:0], and φRFf. In FIG. 5, the delay amount of the delay reference signal REFd is set to be π/8 of the CK cycle of the 1/4 frequency divider 10 with respect to the reference signal REF. Thus, an intermediate value of 8-phase phase information can be acquired. Specifically, by shifting the reference signal REF as described above, the same condition viewed with the reference signal REF having no delay is achieved at the time when the CK advances by π/8, whereby the phase state of the intermediate phase can be found (the intermediate phase generated when data is equally absent). The delay reference signal REFd can be produced by delaying the reference signal REF by π/8 of the CK cycle of the 1/4 frequency divider 10 in the variable delay circuit 13.

Figure 8:
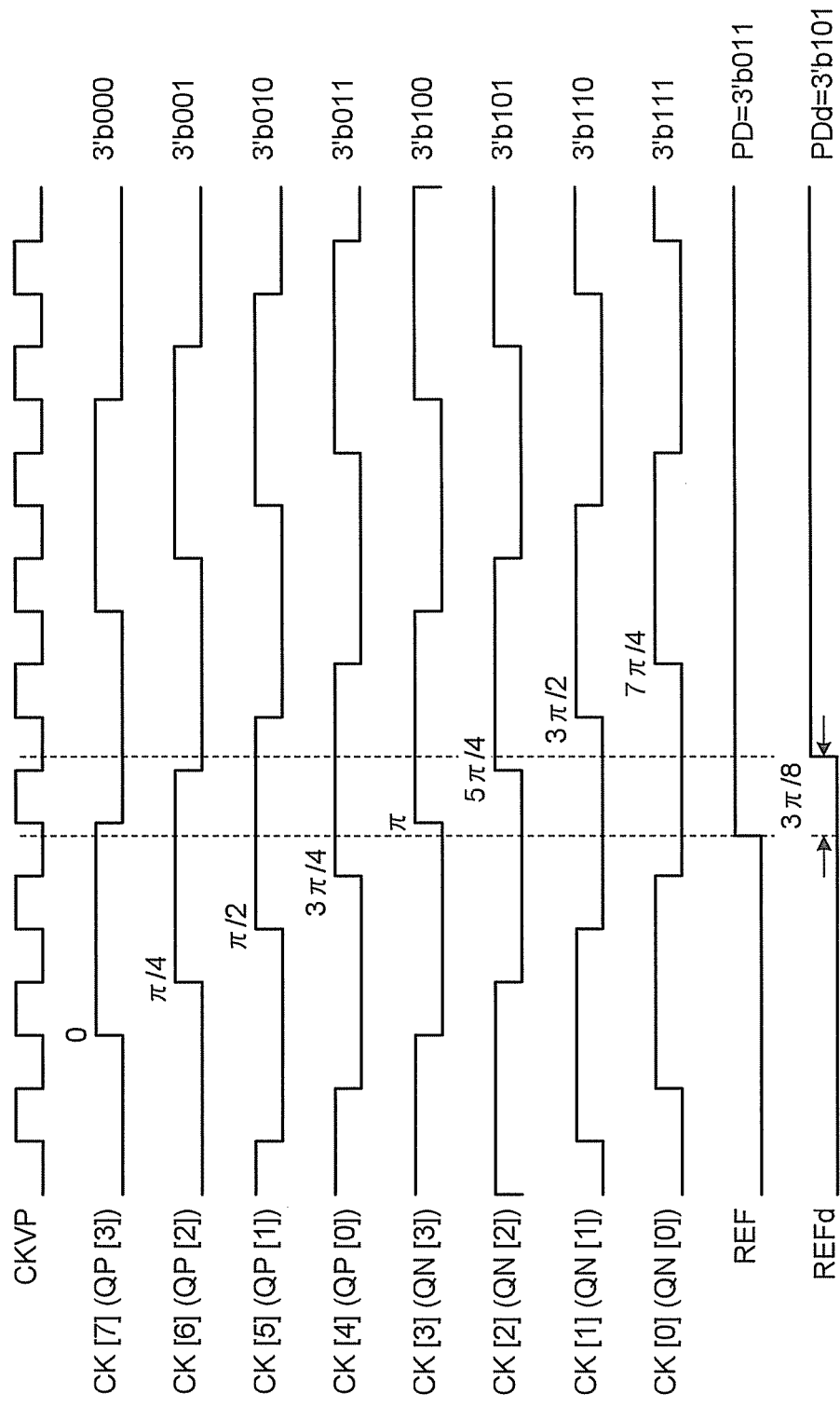
FIG. 8 is a view illustrating the case in which the delay amount of the delay reference signal REFd is set to 3π/8 of the CK cycle of the 1/4 frequency divider with respect to the reference signal REF.

In FIG. 5, the delay amount of the delay reference signal REFd is set to be π/8 of the CK cycle of the 1/4 frequency divider 10 with respect to the reference signal REF. However, it may be set to 3π/8. FIG. 8 illustrates the case in which the delay amount of the delay reference signal REFd is set to be 3π/8 of the CK cycle of the 1/4 frequency divider 10 with respect to the reference signal REF. FIGS. 9 and 10 are views illustrating the relationship of TD[7:0], TDd[7:0], and φRFf.

Shifting the delay reference signal REFd by 3π/8 of the CK cycle of the 1/4 frequency divider 10 with respect to the reference signal REF becomes equal to the condition in which the delay reference signal REFd is in synchronism with the reference signal REF having no delay at the time when the CK is advanced by 3π/8. As a result, an intermediate phase state having an offset by 1 phase (π/4) for the CK can be obtained. When the amount corresponding to the offset is corrected to create the phase information, the effect same as described above can be obtained. Thus, the intermediate phase can be reproduced even under the condition in which the phase information interval of the 1/4 frequency divider 10 is smaller than the delay amount of a CMOS inverter, whereby phase information having resolution higher than that of the TDC using a simple inverter delay can be obtained. When the intermediate phase cannot be obtained by halving 3 phases (3π/4), the interval of an odd-number stage can be halved to achieve the same operation.

Figure 11:
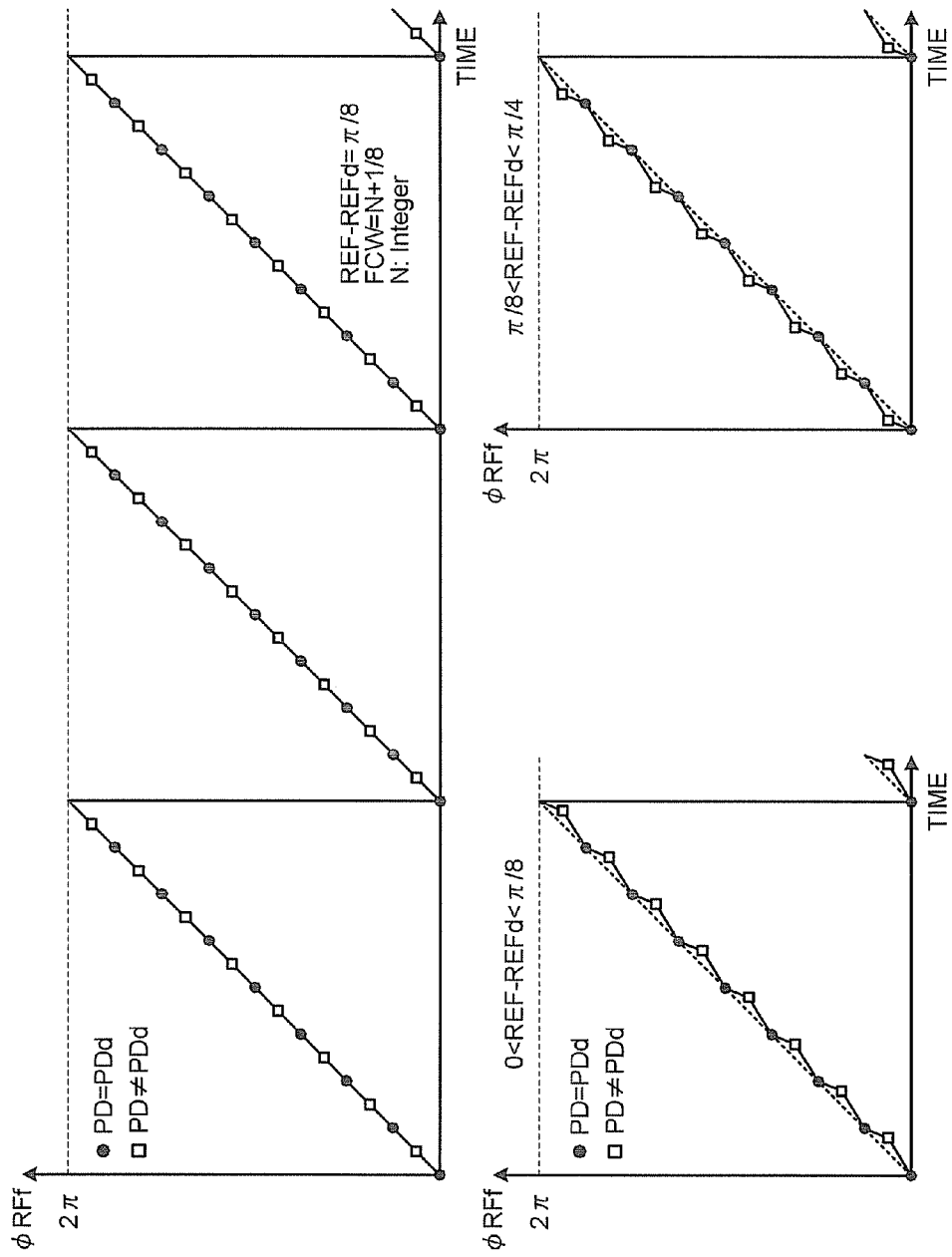
FIG. 11 is a view visually illustrating the relationship between the delay amount of the REF and the phase output.

FIG. 11 is a view visually illustrating the relationship between the delay amount of REF and the phase output. In FIG. 11, if the oscillating cycle of the DCO 1 is N+0.125 times as large as that of the reference signal REF, the phase information below the decimal point increases by π/8 per the interval of the reference signal REF with 2π being defined as a reference. Therefore, it traces the above-mentioned track based upon the obtained phase information PD (obtained by performing a data conversion of TD) and the delay phase information PDd (obtained by performing a data conversion of TDd). If the delay is smaller than the expected delay, the one that should be generated and present at a time cannot be observed. Therefore, the output result is to be observed later than the actual time. If the delay is greater than the expected delay, the reverse phenomenon occurs. It is found from the above that the probability of generating PD=PDd and PD≠PDd becomes 1:1 in the optional output state of the DCO 1 in order to create the intermediate phase.

Figure 12:
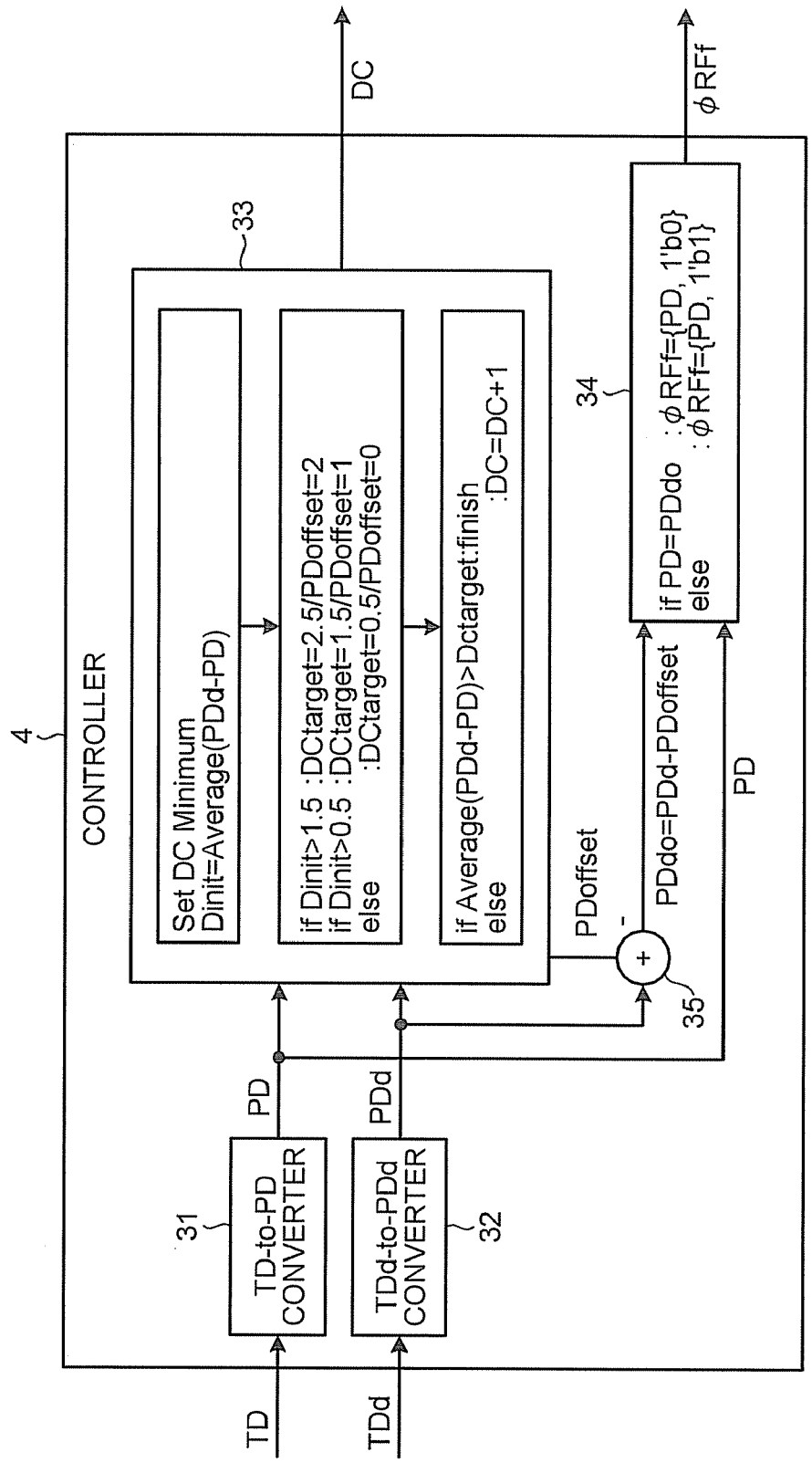
FIG. 12 is a diagram illustrating an example of a configuration of a controller.

FIG. 12 is a view illustrating an example of a configuration of the controller 4. The controller 4 includes a TD-to-PD converter 31, a TDd-to-PDd converter 32, a determining unit 33, an output unit 34, and a subtractor 35. The TD-to-PD converter 31 converts TD into PD by using a table illustrated in FIG. 14. Similarly, the TDd-to-PDd converter 32 converts TDd into PDd by using a table illustrated in FIG. 13 (in FIG. 14, TD=TDd, PD=PDd).

The determining unit 33 performs an adjusting process of the delay control value DC. The adjusting process of the delay control value DC is executed at a predetermined timing such as a timing upon turning on a power source. In the adjusting process of the delay control value DC, the determining unit 33 sets the delay control value DC to the minimum value to establish Dinit=Average (PDd−PD). When Dinit>1.5, the equation of DCtarget=2.5/PDoffset=2 is established, while when 1.5≧Dinit>0.5, the equation of DCtarget=1.5/PDoffset=1 is established. In the case of 0.5≧Dinit, the equation of DCtarget=0.5/PDoffset=0 is established. In the case of Average (PDd−PD)>DC target, the DC in this case is set as the delay control value, and the process is completed. When the inequality of Average (PDd−PD)>DC target is not established, the same process is repeated until the inequality of Average (PDd−PD)>DC target is established with the equation of DC=DC+1.

Specifically, the delay is minimized, and the average in the difference between the delayed phase data and the phase data having no delay is calculated. If this value is 1.5 or more, the delay amount of 3π/8 cannot be realized, so that the target of the delay amount is set to be 5π/8. When the value is 0.5 or less, with which π/8 can be realized, the target is set to be π/8. As described above, the delay is gradually increased toward the target delay amount, and when the delay amount exceeds a desired amount, the delay amount is determined.

In the subtractor 35, $PDd_0$ obtained by subtracting the offset data PDoffset outputted from the controller 4 is outputted from PDd to the output unit 34. In the case of $PD=PDd_0$, the determining unit 34 outputs φRFf=reference phase {PD, 1'b0}. In the case of $PD \neq PDd_0$, the determining unit 34 outputs φRFf=intermediate phase {PD, 1'b1}. The PD and $PDd_0$ are shifted from each other by π/8 under the suitable delay control value DC. The same result can be obtained only by performing the calculation of $(PD+PDd_0)/2$, instead of the determining unit 34.

Figures 13, 14:
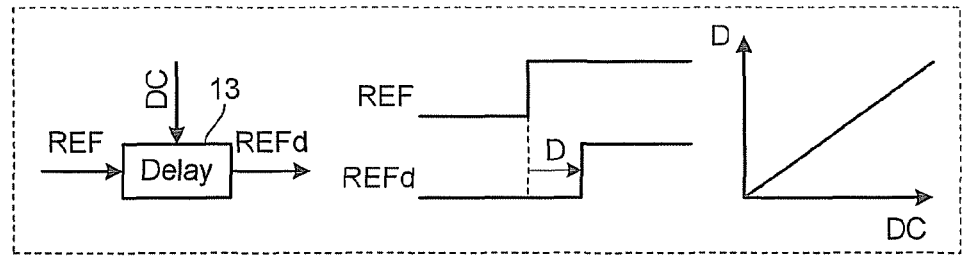
FIG. 13 is a view illustrating one example of a TD-PD conversion table.
FIG. 14 is a view for describing the delay control value DC.

FIG. 14 is a view for describing the delay control value DC. As illustrated in FIG. 14, the delay control value DC is proportional to the delay amount D between the REF and the REFd.

As described above, the local oscillator according to the embodiment 1 includes the DCO 1 that outputs the CKV having the frequency that is N times as large as the Fc according to the OTW, the 1/4 frequency divider 10 that frequency-divides the CKV by 4 to output the 8-phase clock CK, the counter 2 that counts the CK and outputs the count value as φRfi based upon the REF, the flip 11 that latches the CK with the REF and outputs the resultant as TD (first phase information), the variable delay circuit 13 that delays the reference signal REF and outputs the resultant as the delay reference signal REFd, the flip-flop 12 that latches the CK with the delay reference signal and outputs the resultant as the TDd (second phase information), and the controller 4 that controls the delay amount of the variable delay circuit 13 and outputs the fractional oscillator phase data φRFf based upon the TD and TDd. Accordingly, the embodiment 1 can provide the local oscillator that makes the TDC-less structure possible without increasing the power consumption.

In the embodiment 1, the delay amount of the variable delay circuit 13 is set to be π/8, which is a half of π/4 that is the minimum interval of the 8-phase clocks, or 3π/8. Therefore, the local oscillator according to the embodiment 1 can output the fractional oscillator phase data RFf with high precision.

Embodiment 2

Figure 15:
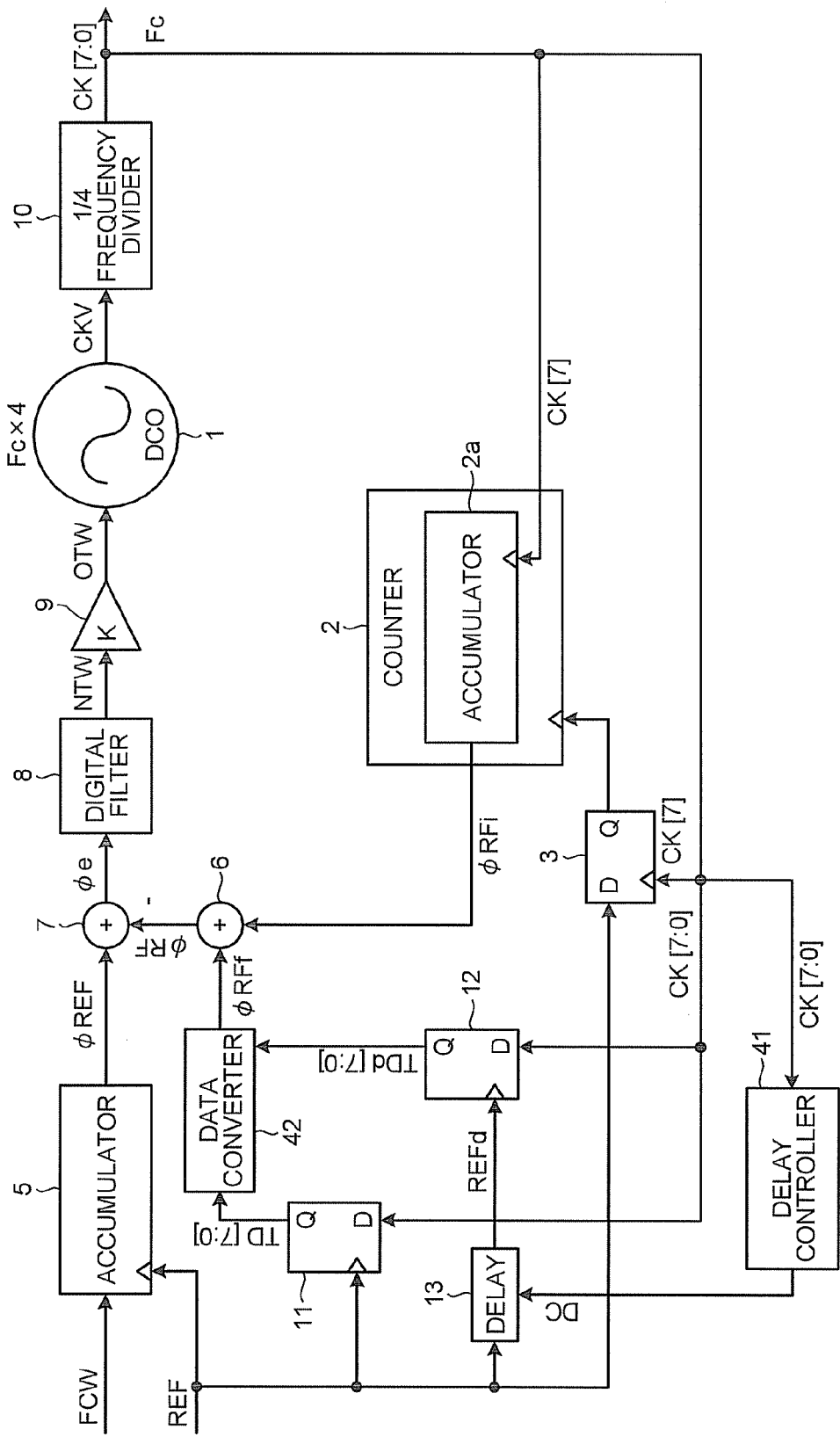
FIG. 15 is a diagram illustrating an example of a configuration of an ADPLL according to an embodiment 2.

FIG. 15 is a view illustrating an example of a configuration of an ADPLL according to an embodiment 2. The ADPLL according to the embodiment 2 has a configuration in which the controller 4 in the embodiment 1 is divided into a delay controller 41 and a data converter 42.

Like the controller 4 in the embodiment 1, the TD[7:0] and TDd[7:0] are inputted to the data converter 42 from the flip-flops 11 and 12, whereby the data converter 42 outputs φRFf to the adder 6. The delay controller 41 outputs the delay control value DC for setting its delay amount to the variable delay circuit 13 based upon the CK[7:0] inputted from the 1/4 frequency divider 10.

Figure 16:
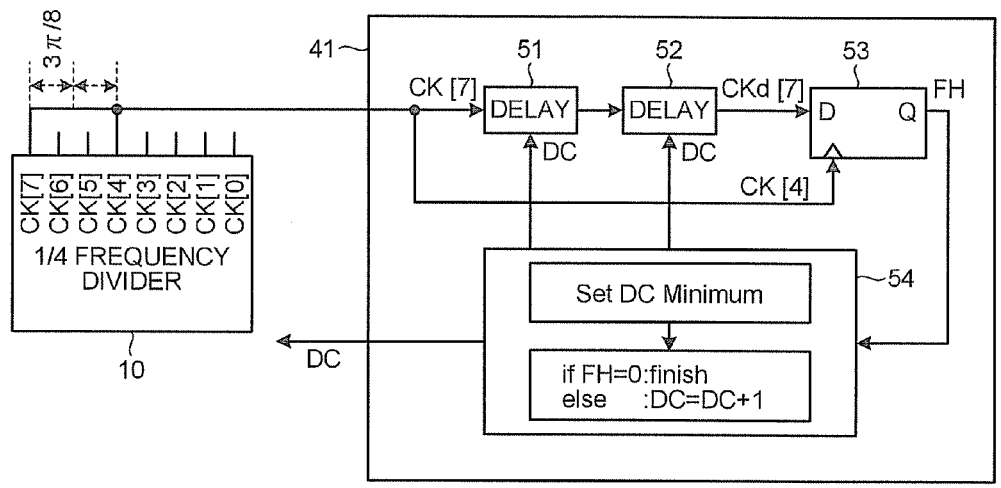
FIG. 16 is a diagram illustrating an example of a configuration of a delay controller.

FIG. 16 is a view illustrating an example of a configuration of the delay controller 41. In FIG. 16, the delay controller 41 includes two delay elements 51 and 52 serially connected to each other, a flip-flop 53, and a setting unit 54. The delay elements 51 and 52 delay CK[7] inputted from the 1/4 frequency divider 10 by the delay control amount DC, and output the CKd[7] to the flip-flop 53. The flip-flop 53 latches the CKd[7] with the CK[4] inputted from the 1/4 frequency divider 10, and outputs an FH to the setting unit 54.

The setting unit 54 determines the speed of the signal between the phase outputs (CK[7], CK[4]), which are apart from each other by 3, across the two delay elements 51 and 52. The setting unit 54 firstly sets the delay amount to the minimum. In the case of FH=0, it ends the process. In the case where FH is not zero, it sets to establish DC=DC+1. When the delay amount is set to be the minimum at the beginning, and then, the delay is increased, the state in which the CKd[7] does not reach occurs, even if the clock CK[4] has arrived. Therefore, the output at this time becomes FH=0. The delay of 6π/8 with respect to the oscillating cycle is produced by the two delay elements 51 and 52. Accordingly, when the similar delay is applied to the REF, the delay reference signal REFd having the delay amount of 3π/8 can be produced. With this process, the output having the intermediate phase information of the CK output with the data having the offset of π/4 can be taken, when π/8 cannot be formed by a general delay element because the CK has a high frequency.

Figure 17:
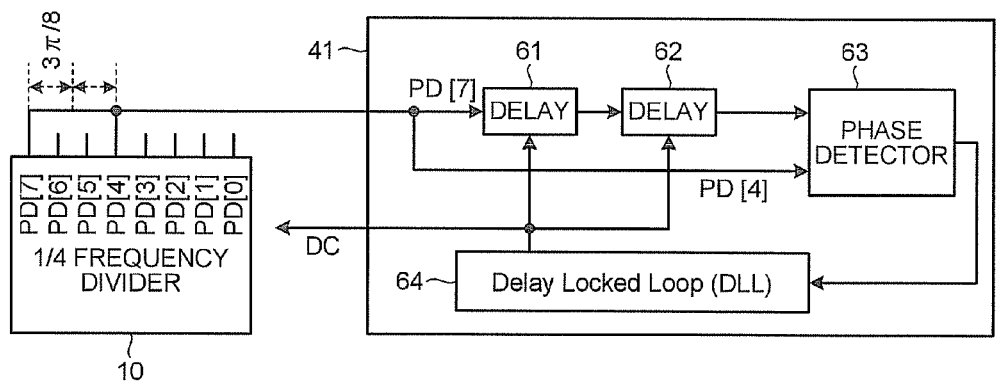
FIG. 17 is a diagram illustrating a configuration in which a DLL (Delay Locked Loop) is used as a delay loop in FIG. 16.

FIG. 17 illustrates the configuration in which a DLL (Delay Locked Loop) is used as a delay loop in FIG. 16. In FIG. 17, a phase detector 63 is used instead of the flip-flop 53, and the DLL 64 is used instead of the determining unit 54.

Figure 18:
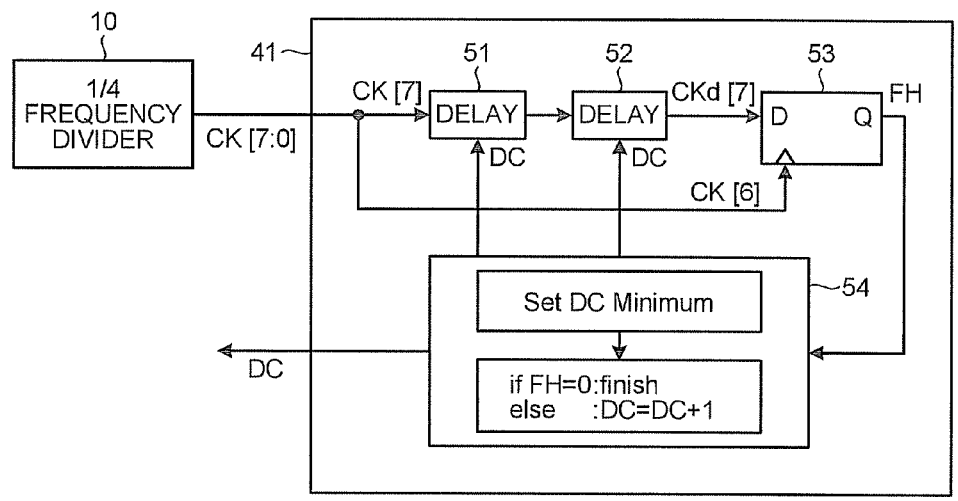
FIG. 18 is a diagram illustrating the case in which the delay amount of π/8 of the CK cycle of a 1/4 frequency divider is generated in FIG. 16.
Figure 19:
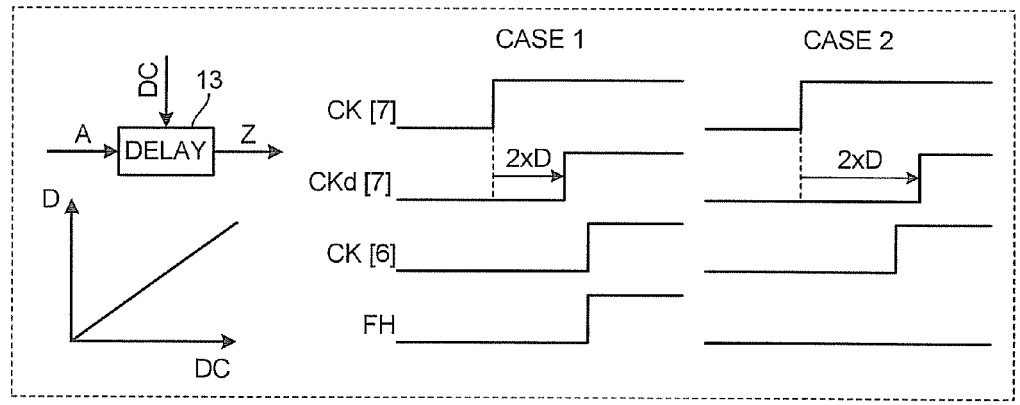
FIG. 19 is a diagram illustrating one example of a timing chart of the delay controller.

FIG. 18 illustrates the case where the delay amount of π/8 of the CK cycle of the 1/4 frequency divider 10 is produced in the delay controller 41 in FIG. 16. FIG. 18 is the same as FIG. 16 except that the clock input of the flip-flop 53 is set to CK[6]. FIG. 19 illustrates one example of a timing chart of the delay controller 41. In FIG. 19, a Case 1 illustrates that the clock CK[6] reaches later than the CKd[7] (FH=1), and a Case 2 illustrates that the clock[6] reaches earlier than the CKd[7] (FH=0).

Embodiment 3

Figure 20:
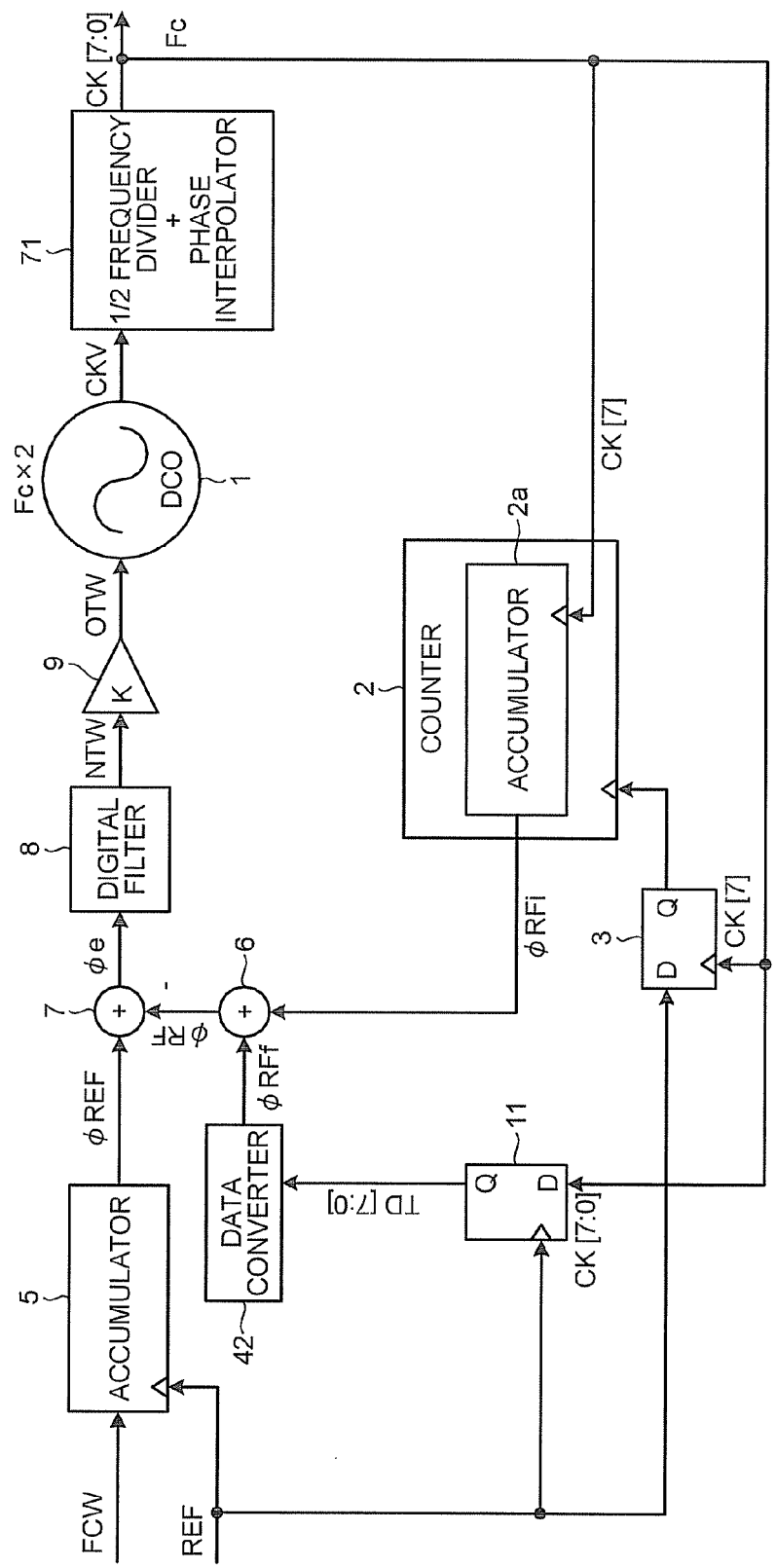
FIG. 20 is a diagram illustrating a configuration of an ADPLL according to an embodiment 3.
Figure 21:
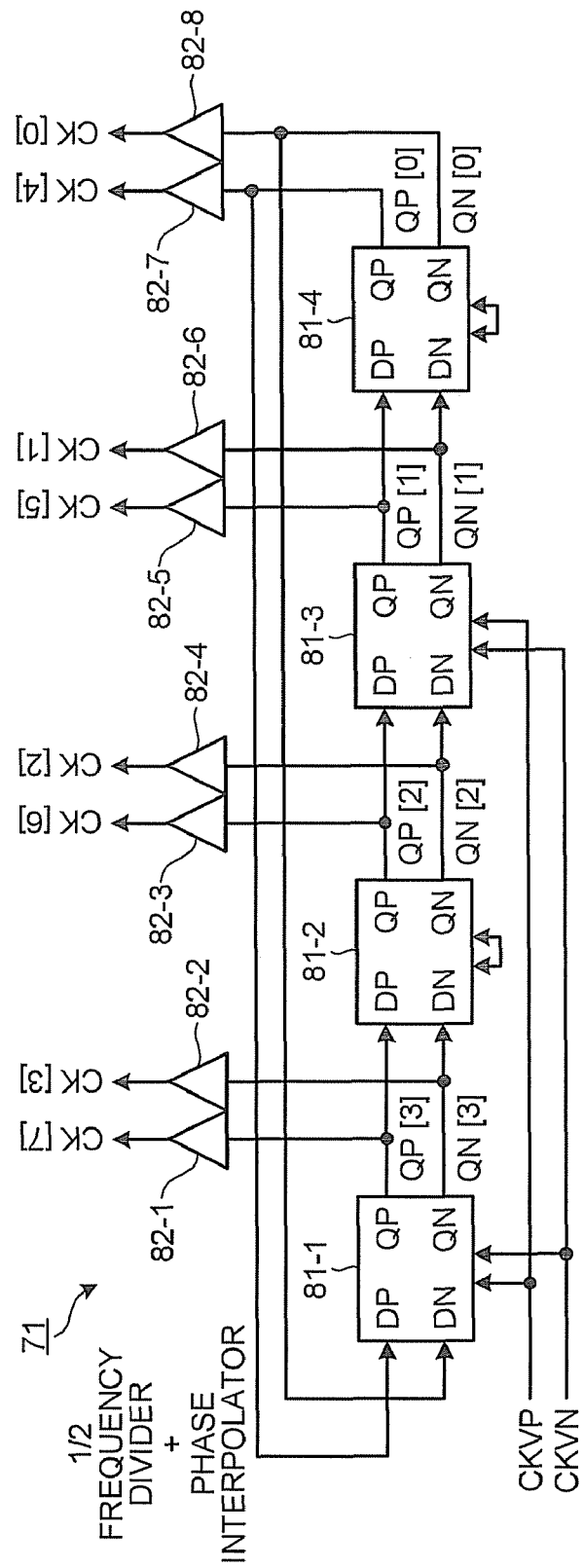
FIG. 21 is a diagram illustrating a configuration of a 1/2 frequency divider.
Figures 22, 23:
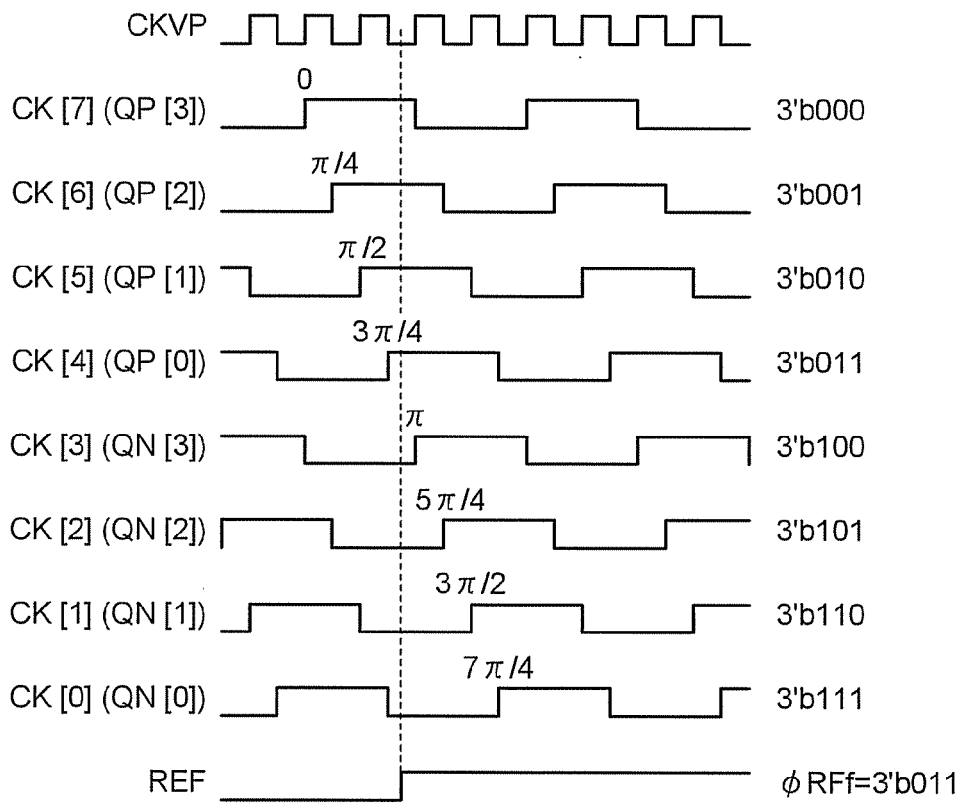
FIG. 22 is a view illustrating one example of a timing chart of the 1/2 frequency divider.
FIG. 23 is a table illustrating a relationship of TD[7:0], TD[7:4], and φRFf.

An embodiment 3 describes a configuration in which 8-phase phase information can be acquired by a frequency divider, when the DCO 1 oscillates by a factor of 2 (Fc×2). FIG. 20 is a diagram illustrating a configuration of an ADPLL according to the embodiment 3, FIG. 21 is a diagram illustrating a configuration of a 1/2 frequency divider 71 in FIG. 20, and FIG. 22 is a view illustrating one example of a timing chart of the 1/2 frequency divider 71 in FIG. 20. FIG. 23 is a table illustrating a relationship of TD[7:0], TD[7:4], and φRFf.

The configuration in FIG. 20 is made by deleting the flip-flop 12, the variable delay circuit 13, and the delay controller 41 in FIG. 15. The DCO 1 doubles the frequency signal Fc according to the oscillator tuning word OTW, and outputs the resultant as the oscillator output signal CKV. The 1/2 frequency divider 10 outputs the CK[7:0] that is obtained by performing a frequency division by 2 to the CKV. The data converter 42 converts the TD[7:0] inputted from the flip-flop 11 into φRFi, and outputs the resultant to the adder 6.

The 1/2 frequency divider 71 in FIG. 21 short-circuits the clock input of the flip-flops 21-2 and 22-4, which are not adjacent to each other, of the flip-flops 22-1 to 22-4 that are serially connected, in the frequency divider illustrated in FIG. 16. Accordingly the 8-phase phase information can be acquired even if the oscillating frequency of the DCO 1 is doubled. As illustrated in FIG. 22, the 8-phase signals CK[7] to CK[0], which are obtained by dividing the oscillating frequency Fc into 8, are outputted, even in case where the CKV is Fc×2.

As described above, according to the embodiment 3, 2 clock inputs of the latches, which are not adjacent to each other, of 4 connected latches are short-circuited, whereby the 8-phase phase information can be acquired, even if the oscillating frequency of the DCO 1 is doubled.

Embodiment 4

Figure 24:
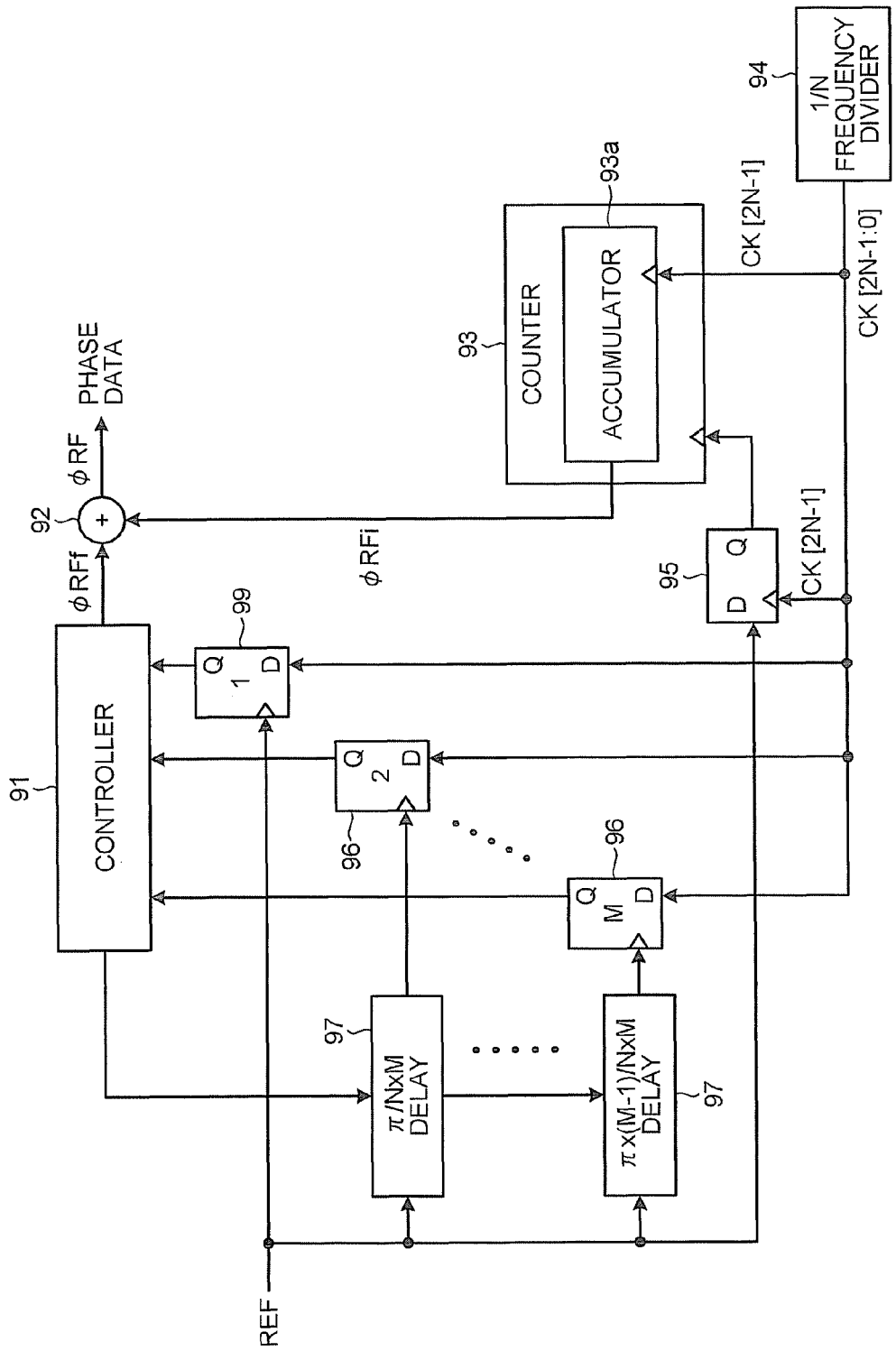
FIG. 24 is a diagram illustrating an example of a configuration of a main part of an ADPLL according to an embodiment 4.

In the embodiment 1, the phase information is divided into 8. In the embodiment 4, the phase information is extended to M-division. FIG. 24 is a diagram illustrating an example of a configuration of a main part of an ADPLL according to the embodiment 4. In FIG. 24, the digital filter 8, the gain correcting device 9, and the DCO 1 are not illustrated.

The phase information obtained by dividing the phase data of the 1/4 frequency divider 10 into (M+1) can be acquired, and the one divided into M can be produced, through the control in which the output probability of the respective phase data pieces becomes 1/(M+1).

A 1/N frequency divider 94 outputs phase information CK[2N−1:0] with 2N phases in synchronism with the input of the DCO 1. A flip-flop 95 latches the reference signal FEF with the CK[2N−1] of the 1/N frequency divider 94 being defined as a clock input, and outputs the resultant to a counter 93. The counter 93 counts the CK[2N−1] of the 1/N frequency divider 94, and outputs the count value to an adder 92 as φRfi in synchronism with the clock inputted from the flip-flop 95.

A controller 91 can divide the interval of the adjacent phases of the CK[2N−1:0] of the 1/N frequency divider 94 into M. The controller 91 outputs the delay control value DC to the respective M−1 variable delay circuits 97. The CK[2N−1:0] of the 1/N frequency divider 94 is inputted to M−1 flip-flops 96 as data. Further, the delay reference signal REFd having the delay amount of π/(M×N)~(M−1)×π/(M×N) with respect to the reference signal REF is inputted to the M−1 flip-flops 96 from M−1 variable delay circuits 98. Thus, the phase resolution of the frequency divider is complemented, and can equivalently be raised to the resolution M times as high as the phase resolution.

Embodiment 5

Figure 25:
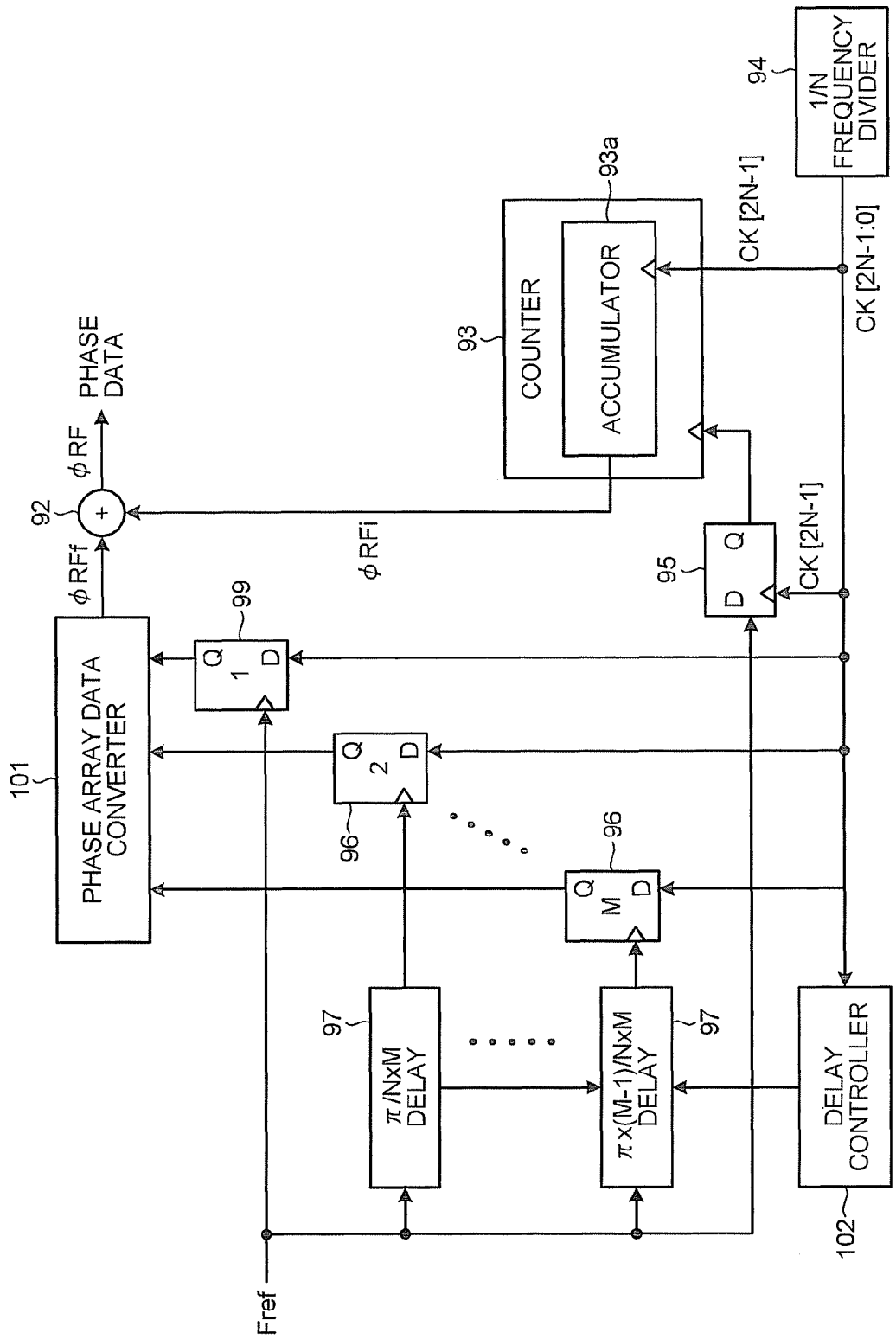
FIG. 25 is a diagram illustrating an example of a configuration of a main part of an ADPLL according to an embodiment 5.

In the embodiment 2, the phase information is divided into 8. In the embodiment 5, the embodiment 2 is extended to M-division. FIG. 25 is a diagram illustrating an example of a configuration of a main part of an ADPLL according to the embodiment 5. In FIG. 25, the digital filter 8, the gain correcting device 9, and the DCO 1 are not illustrated, and the portions having the functions equivalent to those in FIG. 24 are identified by the same numerals.

The ADPLL illustrated in FIG. 25 shows the one obtained by extending the embodiment 2 to an M-division interpolation. The delay controller 102 sets the delay amount of the variable delay circuit 97 of M−1 stages. When the delay is produced by the variable delay circuit 97 of M−1 stages, the phase information, which is obtained by dividing the phase data of the output from the frequency divider into M, can be created. When the variable delay circuit of M stages is used, the interpolation of M stages can be made.

Embodiment 6

Figure 26:
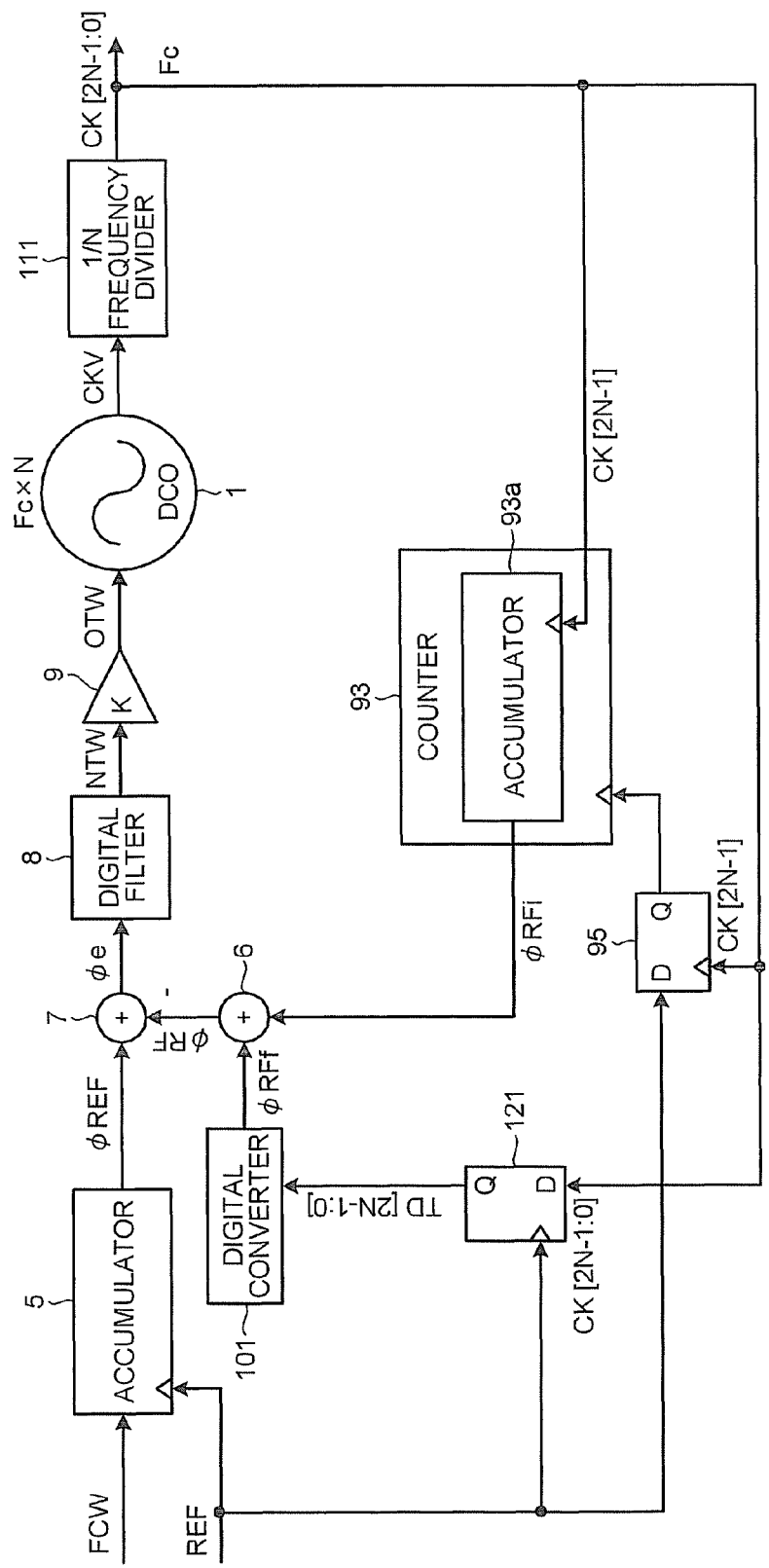
FIG. 26 is a diagram illustrating an example of a configuration of a main part of an ADPLL according to an embodiment 6.

An embodiment 6 describes the configuration in which N-times oscillator and N/1 frequency divider. FIG. 26 illustrates a configuration of an example of an ADPLL according to the embodiment 6. In FIG. 26, the DCO 1 increases the oscillating frequency Fc according to an external control signal OTW by a factor of N, and outputs the resultant as an oscillator output signal CKV. A 1/N frequency divider 111 outputs CK[2N−1:0] obtained by performing a frequency division of the CKV by N. The ADPLL illustrated in FIG. 26 does not have the flip-flop 12, the variable delay circuit 13, and the delay controller 41 in FIG. 15, whereby the ADPLL in FIG. 26 has the minimum necessary configuration.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A local oscillator comprising:
   a digitally-controlled oscillator that outputs an oscillating signal having a frequency N times as large as an oscillating frequency according to an oscillator tuning word;
   a frequency divider that performs a 1/N frequency division of the oscillating signal, and outputs a 2N phase clock;
   a counter that counts the clock and outputs the count value as integer oscillator phase data based upon a reference signal;
   a first flip-flop that latches the clock with the reference signal, and outputs the resultant as first phase information;
   a variable delay circuit that delays the reference signal and outputs the resultant as a delay reference signal;
   a second flip-flop that latches the clock with the delay reference signal, and outputs the resultant as second phase information;
   a delay control unit that controls a delay amount of the variable delay circuit;
   a data conversion unit that outputs fractional oscillator phase data based upon the first and second phase information;
   an adder that adds the integer oscillator phase data and the fractional oscillator phase data, and outputs the added value as third phase information; and
   a filter that smoothes the difference between a reference phase for setting the oscillating frequency of the digitally-controlled oscillator and the third phase information so as to output the oscillator tuning word.

2. A local oscillator according to claim 1, wherein the delay control unit sets the delay amount of the variable delay circuit to a half of the minimum interval of the 2N phase clock.

3. A local oscillator according to claim 2, wherein N=4, and the delay amount of the variable delay circuit is $\pi/8$ or $3\pi/8$.

4. A local oscillator according to claim 1, wherein the delay control unit calculates a delay control value for controlling the delay amount of the variable delay circuit based upon the first phase information and the second phase information.

5. A local oscillator according to claim 4, wherein the delay control unit adjusts the delay control value at a predetermined timing such as the timing upon turning on a power source.

6. A local oscillator according to claim 1, wherein the delay control unit calculates a delay control value for controlling the delay amount of the variable delay circuit based upon the 2N phase clock.

7. A phase adjusting method for a local oscillator comprising:
   outputting, by a digitally-controlled oscillator, an oscillating signal having a frequency N times as large as an oscillating frequency according to an oscillator tuning word;
   performing a 1/N frequency division of the oscillating signal, and outputting a 2N phase clock;
   counting the clock and outputting the count value as integer oscillator phase data based upon a reference signal;
   latching the clock with the reference signal, and outputting the resultant as first phase information;
   delaying, by a variable delay circuit, the reference signal and outputting the resultant as a delay reference signal;
   latching the clock with the delay reference signal, and outputting the resultant as second phase information;
   controlling a delay amount of the variable delay circuit;
   outputting fractional oscillator phase data based upon, the first and second phase information;
   adding the integer oscillator phase data and the fractional oscillator phase data, and outputting the added value as third phase information; and
   smoothing the difference between a reference phase for setting the oscillating frequency of the digitally-controlled oscillator and the third phase information so as to output the oscillator tuning word.

8. A phase adjusting method according to claim 7, wherein the controlling a delay amount includes setting the delay amount of the variable delay circuit to a half of the minimum interval of the 2N phase clock.

9. A phase adjusting method according to claim 8, wherein N=4, and the delay amount of the variable delay circuit is $\pi/8$ or $3\pi/8$.

10. A phase adjusting method according to claim 7, wherein the controlling the delay, amount includes calculating a delay control value for controlling the delay amount of the variable delay circuit based upon the first phase information and the second phase information.

11. A phase adjusting method according to claim 10, wherein the controlling the delay amount includes adjusting the delay control value at a predetermined timing such as the timing upon turning on a power source.

12. A phase adjusting method according to claim 7, wherein the controlling the delay amount includes calculating a delay control value for controlling the delay amount of the variable delay circuit based upon the 2N phase clock.

* * * * *